(12) United States Patent
Kawada et al.

(10) Patent No.: US 10,305,267 B2
(45) Date of Patent: May 28, 2019

(54) ELECTRICAL CONNECTION BOX AND WIRE HARNESS

(71) Applicant: Yazaki Corporation, Tokyo (JP)

(72) Inventors: Daisuke Kawada, Shizuoka (JP); Yuki Komiya, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 15/249,010

(22) Filed: Aug. 26, 2016

(65) Prior Publication Data
US 2017/0070040 A1 Mar. 9, 2017

(30) Foreign Application Priority Data

Sep. 3, 2015 (JP) ................................. 2015-173550

(51) Int. Cl.
H02G 3/08 (2006.01)
B60R 16/023 (2006.01)
(Continued)

(52) U.S. Cl.
CPC ......... *H02G 3/088* (2013.01); *B60R 16/0238* (2013.01); *H02G 3/08* (2013.01);
(Continued)

(58) Field of Classification Search
CPC ............ H02G 3/088; H02G 3/08; H02G 3/10; H02G 3/14; H02G 3/081; B60R 16/0215;
(Continued)

(56) References Cited

U.S. PATENT DOCUMENTS 4,298,204 A * 11/1981 Jinkins ................... F16J 15/062
220/378
5,531,345 A  7/1996 Nakamura et al.
(Continued)

FOREIGN PATENT DOCUMENTS

CN  101742849 A  6/2010
JP  1-107652 U  7/1989
(Continued)

OTHER PUBLICATIONS

Japanese Office Action for the related Japanese Patent Application No. 2015-173550 dated Jan. 9, 2018.
(Continued)

*Primary Examiner* — Steven T Sawyer
*Assistant Examiner* — Paresh H Paghadal
(74) *Attorney, Agent, or Firm* — Kenealy Vaidya LLP

(57) ABSTRACT

An electrical connection box includes a box main body having an opening portion in an upper end portion at a time of installation, and an upper cover that blocks the opening portion at the time of installation. The box main body has an insertion wall portion continuously formed along an outer circumference of the box main body in the upper end portion at the outer circumference of the box main body. The upper cover has a groove portion continuously formed along an outer circumference of the upper cover in a lower end portion at the outer circumference of the upper cover. Here, the insertion wall portion is inserted into the groove portion from lower side when the opening portion of the box main body is blocked. At least one rib protruding downward from a bottom portion of the groove portion is formed in the groove portion.

4 Claims, 5 Drawing Sheets

(51) Int. Cl.
- *H02G 3/14* (2006.01)
- *H01H 9/04* (2006.01)
- *H02G 3/10* (2006.01)
- *H01H 9/02* (2006.01)
- *H05K 5/06* (2006.01)
- *B65D 43/02* (2006.01)
- *H05K 5/00* (2006.01)

(52) U.S. Cl.
CPC .......... *H02G 3/081* (2013.01); *B60R 16/0239* (2013.01); *B65D 43/0227* (2013.01); *B65D 43/0233* (2013.01); *B65D 43/0239* (2013.01); *B65D 2543/00453* (2013.01); *B65D 2543/00462* (2013.01); *B65D 2543/00657* (2013.01); *B65D 2543/00768* (2013.01); *H01H 9/02* (2013.01); *H01H 9/04* (2013.01); *H02G 3/10* (2013.01); *H02G 3/14* (2013.01); *H05K 5/006* (2013.01); *H05K 5/0013* (2013.01); *H05K 5/061* (2013.01); *H05K 5/062* (2013.01); *H05K 5/063* (2013.01); *H05K 5/064* (2013.01); *H05K 5/065* (2013.01)

(58) Field of Classification Search
CPC .. B60R 16/0238; B60R 16/0239; H01H 9/02; H01H 9/04; H05K 5/06; H05K 5/0013; H05K 5/0052; H05K 5/061–065; B65D 43/0227; B65D 43/0233; B65D 43/0239; B65D 2543/00453; B65D 2543/00462; B65D 2543/00657; B65D 2543/00768
See application file for complete search history.

(56) References Cited

U.S. PATENT DOCUMENTS

| | | | | |
|---|---|---|---|---|
| 5,703,325 A * | 12/1997 | Yamaguchi | ............ | H02G 3/088 174/50 |
| 7,414,190 B2 * | 8/2008 | Vo | .......... | H05K 5/063 174/50 |
| 8,052,001 B2 * | 11/2011 | Chen | ...................... | H05K 5/063 220/4.02 |
| 9,099,850 B2 * | 8/2015 | Kakimi | .................. | H02G 3/088 |
| 2002/0084271 A1 * | 7/2002 | Sato | ........................ | H02G 3/088 220/3.8 |
| 2002/0112870 A1 * | 8/2002 | Kobayashi | ........... | H05K 5/0052 174/50 |
| 2003/0000720 A1 | 1/2003 | Sato | | |
| 2003/0000726 A1 | 1/2003 | Miyakoshi | | |
| 2003/0230574 A1 * | 12/2003 | Okada | .................... | H02G 3/088 220/3.8 |
| 2006/0096774 A1 * | 5/2006 | Vo | ......................... | H05K 5/063 174/67 |
| 2008/0083549 A1 | 4/2008 | Iizuka | | |
| 2010/0127012 A1 * | 5/2010 | Takeuchi | ................ | H02G 3/14 220/810 |
| 2010/0307814 A1 * | 12/2010 | Aoki | ................... | B60R 16/0238 174/520 |
| 2013/0034974 A1 * | 2/2013 | Akahori | ............... | H01R 9/2458 439/76.2 |
| 2013/0292383 A1 * | 11/2013 | Mullaney | ............... | B65D 53/06 220/378 |

FOREIGN PATENT DOCUMENTS

| | | |
|---|---|---|
| JP | 4-121324 U | 10/1992 |
| JP | 7-27237 U | 5/1995 |
| JP | 9-39687 A | 2/1997 |
| JP | 9-118340 A | 5/1997 |
| JP | 2002-369334 A | 12/2002 |
| JP | 2002-369335 A | 12/2002 |
| JP | 2003-252356 A | 9/2003 |
| JP | 2010-130705 A | 6/2010 |

OTHER PUBLICATIONS

Japanese Office Action for the related Japanese Patent Application No. 2015-173550 dated Oct. 3, 2017.
Chinese Office Action for the related Chinese Patent Application No. 201610792546.4 dated Nov. 3, 2017.
Chinese Office Action for the related Chinese Patent Application No. 201610792546.4 dated Jun. 5, 2018.

* cited by examiner

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2015-173550 filed in Japan on Sep. 3, 2015.

BACKGROUND OF THE INVENTION

1. Field of the Invention

The present invention relates to an electrical connection box and a wire harness.

2. Description of the Related Art

In some cases, a conventional electrical connection box applied to a wire harness which is installed in a vehicle such as an automobile is installed in a place exposed to an external environment unlike a vehicle interior such as an engine room. Normally, the electrical connection box has a division structure in which a housing includes a plurality of housing members, and employs a waterproof structure that inhibits a liquid from entering the interior from outside between adjacent housing members. Normally, the waterproof structure inserts an insertion wall portion, which is formed along an outer circumference of a second housing member positioned at a lower side and protrudes upward, into a groove portion, which is formed along an outer circumference of a first housing member positioned at an upper side and is opened downward (see Japanese Patent Application Laid-open Nos. 2002-369335, 2003-252356, and 2010-130705).

Incidentally, a gap is formed between a bottom portion corresponding to an upper end portion of the groove portion and a distal portion of the insertion wall portion. The gap is continuously formed along the outer circumference of the first housing. Normally, even when a liquid splashes onto the housing from outside, the possibility that the liquid will enter the gap is low. However, for example, when the engine room is cleaned by high-pressure washing, liquid strongly collides with the housing, and there is a possibility that a large amount of liquid enters the gap. When a large amount of liquid enters the gap, liquid may flow along an extending direction of the groove portion, and stay in a corner portion at the outer circumference of the first housing member. In this way, there is a possibility that liquid entering the gap may spout into the housing.

SUMMARY OF THE INVENTION

An object of the present invention is to provide an electrical connection box and a wire harness capable of inhibiting liquid entering between the first housing member and the second housing member from the outside of the housing from spouting into the housing.

In order to achieve the above mentioned object, an electrical connection box according to one aspect of the present invention includes a first housing member having an opening portion in an upper end portion at a time of installation; and a second housing member that is positioned at an upper side with respect to the first housing member, and blocks the opening portion at the time of installation, wherein the first housing member has an insertion wall portion continuously formed along an outer circumference of the first housing member in the upper end portion at the outer circumference of the first housing member, the second housing member has a groove portion continuously formed along an outer circumference of the second housing member in a lower end portion at the outer circumference of the second housing member, the insertion wall portion being inserted into the groove portion from a lower side when the opening portion of the first housing member is blocked, and at least one rib protruding downward from a bottom portion of the groove portion is formed in the groove portion.

According to another aspect of the present invention, in the electrical connection box, it is preferable that the groove portion has a plurality of sides, and corner portions connecting adjacent sides, and at least one rib is formed on each of the sides.

According to still another aspect of the present invention, in the electrical connection box, it is preferable that ribs are formed with the corner portions interposed therebetween on the respective sides.

In order to achieve the above mentioned object, a wire harness according to still another aspect of the present invention includes an electric wire; and an electrical connection box including a first housing member having an opening portion in an upper end portion at a time of installation, and a second housing member that is positioned at an upper side with respect to the first housing member, and blocks the opening portion at the time of installation, wherein the first housing member has an insertion wall portion continuously formed along an outer circumference of the first housing member in the upper end portion at the outer circumference of the first housing member, the second housing member has a groove portion continuously formed along an outer circumference of the second housing member in a lower end portion at the outer circumference of the second housing member, the insertion wall portion being inserted into the groove portion from a lower side when the opening portion of the first housing member is blocked, and at least one rib protruding downward from a bottom portion of the groove portion is formed in the groove portion.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a detailed description will be given of an embodiment of an electrical connection box and a wire harness according to the present invention based on drawings. It should be noted that the present invention is not restricted by the embodiment. In addition, a component in the embodiment below includes a component that can be easily assumed by those skilled in the art or substantially the same component. Further, a component in the embodiment below may be variously omitted, replaced, and modified within the scope not departing from a subject matter of the present invention.

Embodiment

Figure 1:
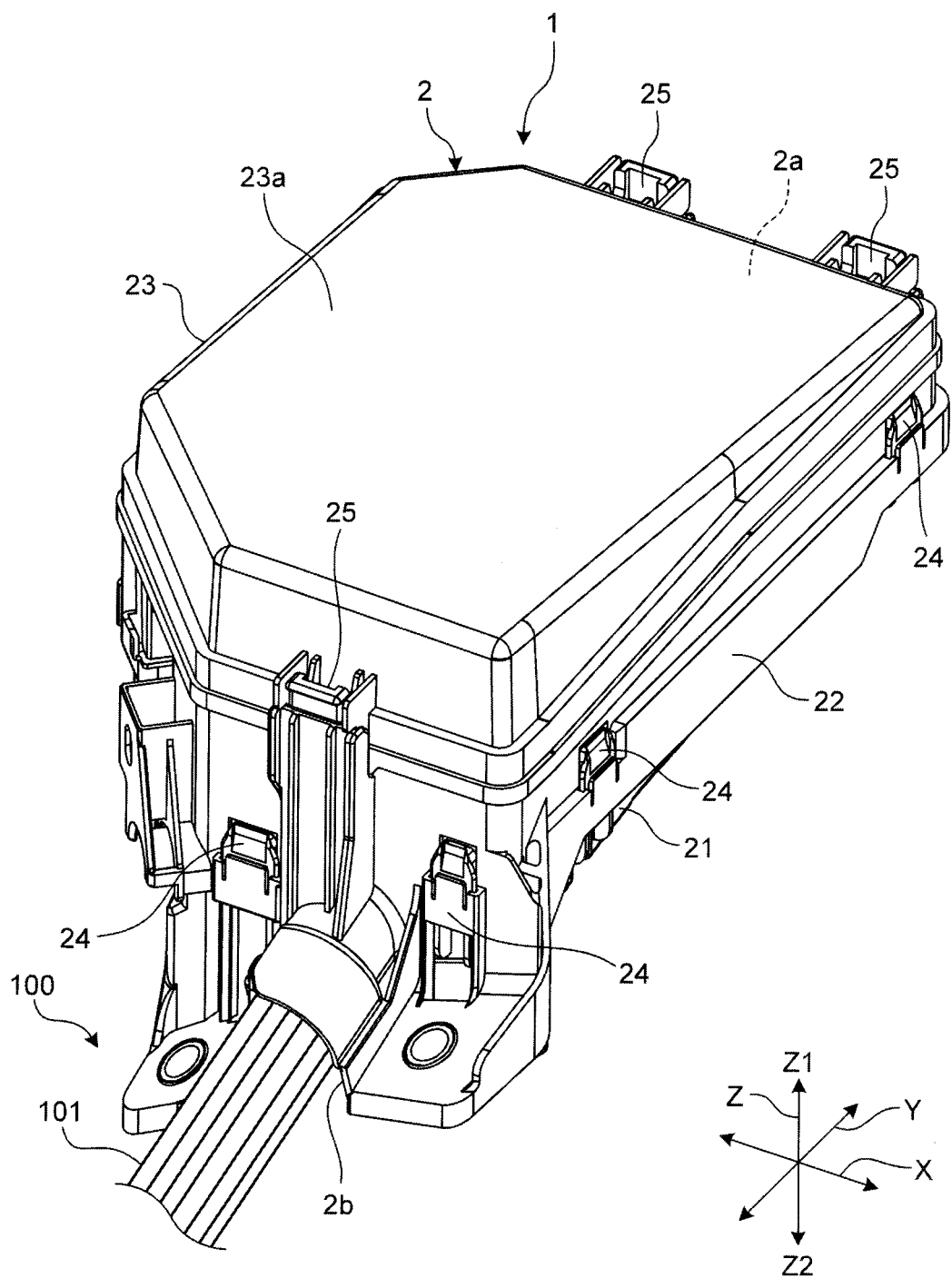
FIG. 1 is a perspective view illustrating an electrical connection box according to an embodiment.
Figure 2:
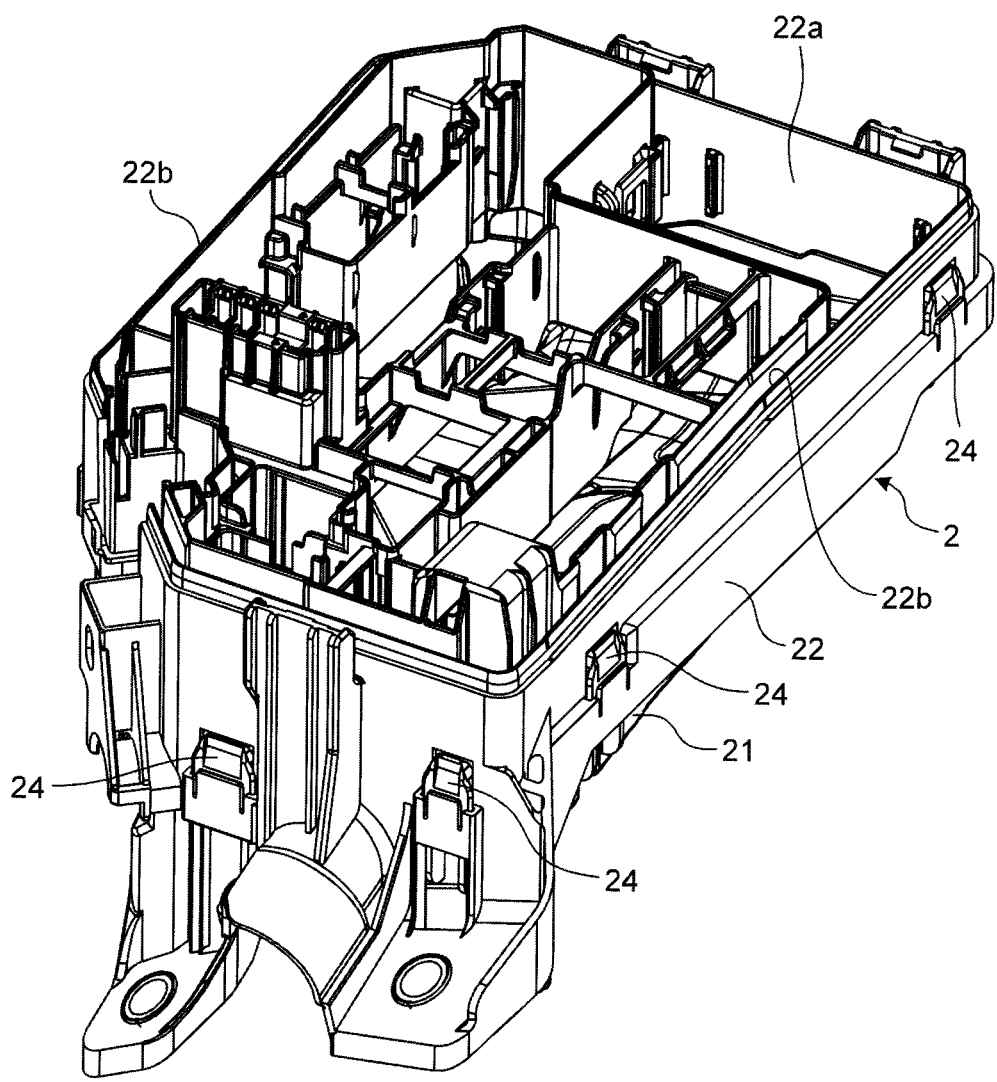
FIG. 2 is a perspective view illustrating a housing of the electrical connection box according to the embodiment in which an upper cover is removed from the housing.
Figure 3:
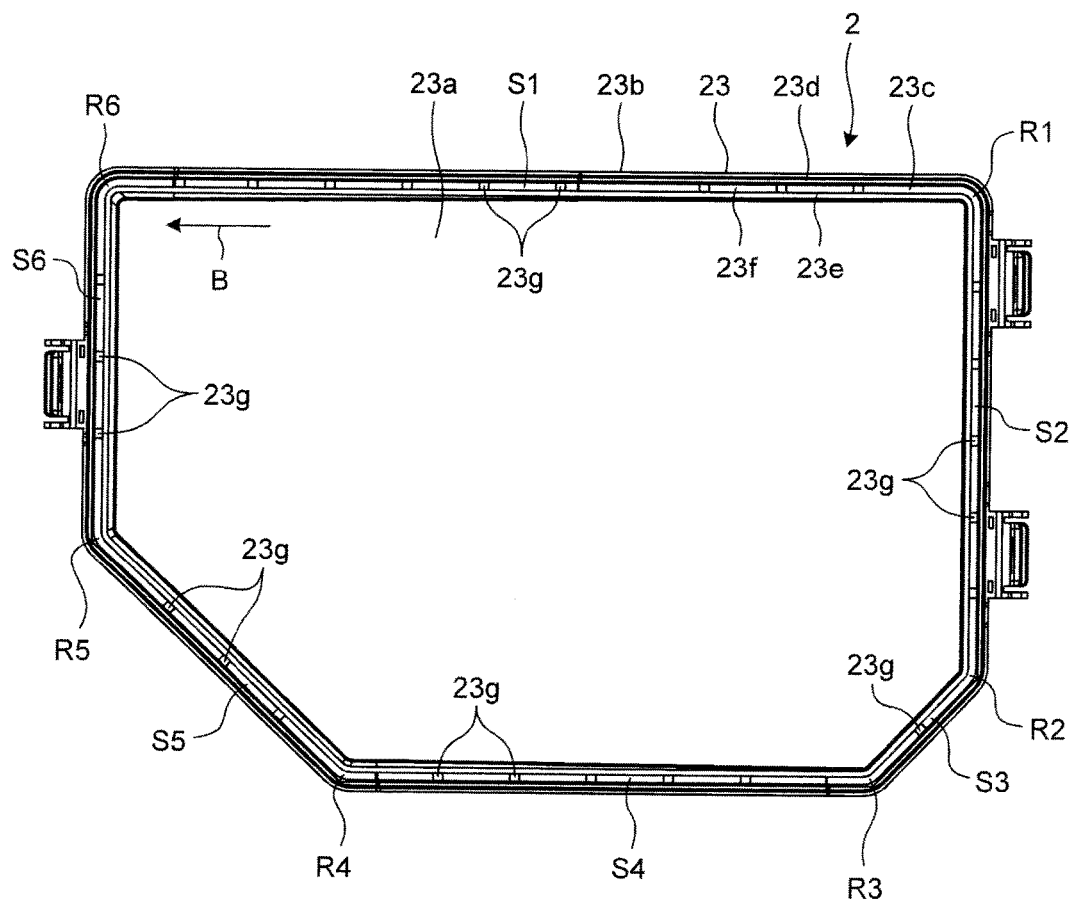
FIG. 3 is a rear view of the upper cover of the electrical connection box according to the embodiment.
Figure 3:
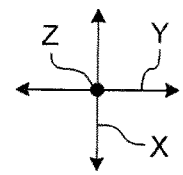
Figure 4:
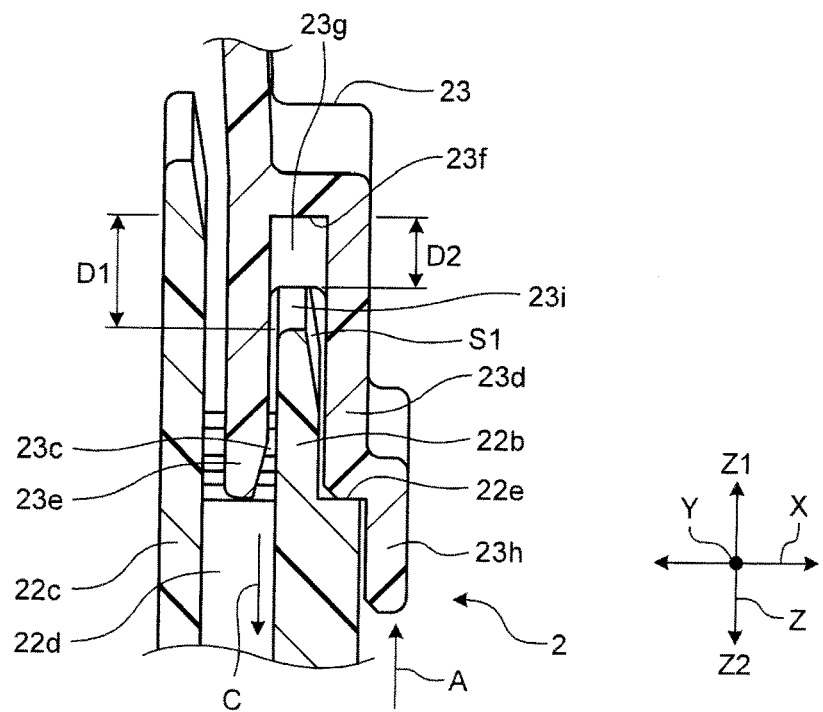
FIG. 4 is a cross-sectional view of a main portion of the housing of the electrical connection box according to the embodiment.
Figure 5:
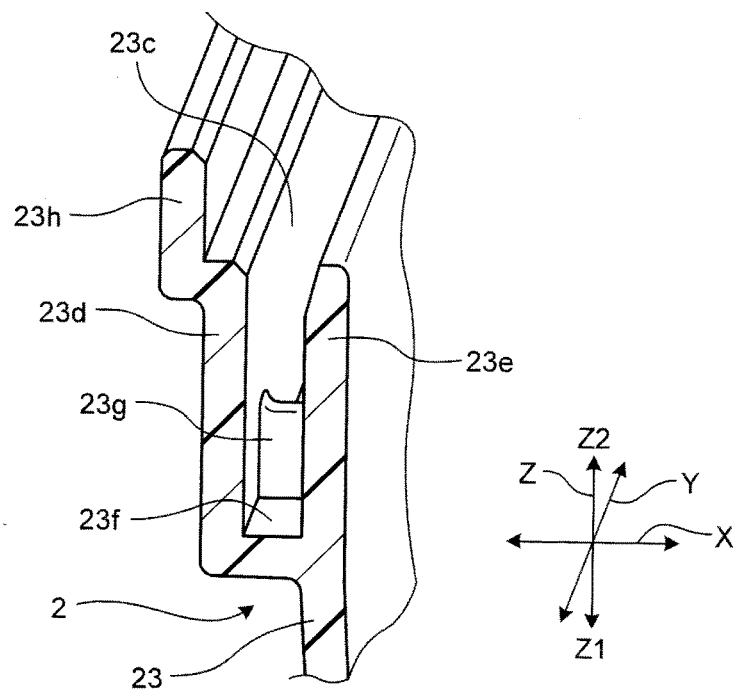
FIG. 5 is a cross-sectional perspective view of a main portion of the upper cover of the electrical connection box according to the embodiment.

First, a description will be given of an electrical connection box and a wire harness according to an embodiment. FIG. 1 is a perspective view illustrating an electrical connection box according to an embodiment. FIG. 2 is a perspective view illustrating a housing of the electrical connection box according to the embodiment in which an upper cover is removed from the housing. FIG. 3 is a rear view of the upper cover of the electrical connection box according to the embodiment. FIG. 4 is a cross-sectional view of a main portion of the housing of the electrical connection box according to the embodiment. FIG. 5 is a cross-sectional perspective view of a main portion of the upper cover of the electrical connection box according to the embodiment. Herein, an X-direction of the respective figures (including FIG. 6) is a width direction of the electrical connection box according to the present embodiment. A Y-direction is a longitudinal direction of the electrical connection box in the present embodiment, and is a direction perpendicular to the width direction. A Z-direction is an up-down direction of the electrical connection box in the present embodiment, and is a direction perpendicular to the width direction and the longitudinal direction. A Z1-direction is an upward direction, and a Z2-direction is a downward direction.

An electrical connection box 1 in the present embodiment is installed in a vehicle such as an automobile to distribute power supplied from a power supply such as a battery to various electronic equipments installed in the vehicle through various electronic components or the like. Here, the electrical connection box 1 is incorporated in a wire harness 100 to integrate and accommodate electronic components such as a connector, a fuse, a relay, a junction, and an electronic control unit included in a connection processing component of an electric wire 101 or the like. The electrical connection box 1 in the present embodiment is installed in a place exposed to an external environment such as an engine room of the vehicle, and is connected between a power supply such as a battery and various electronic equipments installed in the vehicle. The electrical connection box 1 is referred to as a junction box, a fuse box, a relay box or the like in some cases. However, in the present embodiment, the electrical connection box is used as a general term. The electrical connection box 1 is installed in the vehicle such that the up-down direction (Z) is identical to a vertical direction or forms an arbitrary angle with the vertical direction. As illustrated in FIG. 1, the electrical connection box 1 includes a housing 2 which has a plurality of housing components.

The housing 2 is formed using an insulating synthetic resin, and accommodates an electronic component (not illustrated) in an internal space portion 2a formed therein. Here, the electric wire 101, which is inserted into the internal space portion 2a from an insertion hole 2b formed in the housing 2, is connected to at least a portion of the electronic component. The housing 2 includes a lower cover 21, a box main body 22, and an upper cover 23, and has a structure in which a plurality of layers (three layers) is stacked in an order of the lower cover 21, the box main body 22, and the upper cover 23 from a lower side, that is, a structure in which the housing 2 is divided into the plurality of housing components.

The lower cover 21 is a plate-shaped (tray-shaped) member, and blocks an opening portion (lower side opening portion) (not illustrated) formed in a lower end portion of the box main body 22. The lower cover 21 is locked at a lower side with respect to the box main body 22 by a plurality of locking mechanisms 24.

The box main body 22 is a first housing member, and an opening portion 22a is formed in an upper end portion thereof as illustrated in FIG. 2 when viewed in the up-down direction at the time of installation. An outer circumferential shape of the box main body 22 is formed in a substantially rectangular shape identical (or substantially identical) to an outer circumferential shape of the upper cover 23 when viewed in the up-down direction at the time of installation. The box main body 22 is formed in a tubular shape in which the opening portion 22a in the upper end portion and the opening portion in the lower end portion communicate with each other in the up-down direction. An internal space portion of the box main body 22 according to the present embodiment is divided into a plurality of sections, and an electronic component or a box accommodating the electronic component such as a fuse box is directly inserted into and held in a divided space portion. In the box main body 22, an insertion wall portion 22b is formed in the upper end portion at an outer circumference when viewed in the up-down direction at the time of installation. The insertion wall portion 22b is continuously formed along the outer circumference. In the insertion wall portion 22b, as illustrated in FIG. 4, a stepped portion 22e is formed around a distal portion, that is, an upper end portion. The stepped portion 22e is formed in parallel to a surface perpendicular to the up-down direction (a horizontal plane) at an outside, that is, an outer side of the box main body 22. The stepped portion 22e is continuously formed along the outer circumference. In the box main body 22, a partition wall portion 22c is formed at an inside, that is, an inner side of the insertion wall portion 22b. The partition wall portion 22c is continuously formed along the outer circumference in parallel to the insertion wall portion 22b. In the box main body 22, a drainage space portion 22d is formed between the insertion wall portion 22b and the partition wall portion 22c. The drainage space portion 22d is continuously formed along the outer circumference, and a connection portion (not illustrated) that connects the insertion wall portion 22b and the partition wall portion 22c to each other is formed at a plurality of places along the outer circumference of the box main body 22. In the drainage space portion 22d, a lower end portion (not illustrated) is opened to the outside of the electrical connection box 1.

The upper cover 23 is a second housing member which is positioned at an upper side with respect to the box main body 22 at the time of installation as illustrated in FIG. 1 when viewed in the up-down direction and blocks the opening portion 22a. The upper cover 23 is locked at the upper side with respect to the box main body 22 by a plurality of locking mechanisms 25. As illustrated in FIG. 3, the upper cover 23 is a lid-shaped member, and includes a ceiling portion 23a and a frame portion 23b. The ceiling portion 23a has a flat plate shape, and is included in a ceiling of the housing 2. The frame portion 23b is included in the outer circumference of the upper cover 23 when viewed in the up-down direction at the time of installation, and is formed to protrude downward from an outer circumferential end portion of the ceiling portion 23a. An outer circumferential shape of the upper cover 23 is formed in a substantially rectangular shape when viewed in the up-down direction at the time of installation. In the upper cover 23, a groove portion 23c is formed in a lower end portion at the outer circumference when viewed in the up-down direction at the time of installation.

As illustrated in FIG. 3, the groove portion 23c is continuously formed along the outer circumference. As illustrated in FIG. 4, the insertion wall portion 22b is inserted into the groove portion 23c from lower side when the upper cover 23 blocks the opening portion 22a of the box main body 22, that is, in a state in which the upper cover 23 is locked at the upper side with respect to the box main body 22 by the plurality of locking mechanisms 25. In the groove portion 23c, an opening is formed in a lower end portion. The groove portion 23c includes an external wall portion 23d, an internal wall portion 23e, and a bottom portion 23f. The external wall portion 23d is formed in a lower end portion at the outer circumference when viewed in the up-down direction at the time of installation. The external wall portion 23d is continuously formed along the outer circumference. In the external wall portion 23d, an offset portion 23h is formed at a distal portion, that is, a lower end portion. The offset portion 23h is formed to protrude to an outside, that is, an outer side of the box main body 22 and extend downward. The internal wall portion 23e is formed on an inside, that is, an inner side of the external wall portion 23d. The internal wall portion 23e is connected to the external wall portion 23d through the bottom portion 23f, and is continuously formed along the outer circumference in parallel to the external wall portion 23d. In the groove portion 23c in the present embodiment, six sides S1, S2, S3, S4, S5, and S6 are formed as a plurality of sides. The respective sides S1, S2, S3, S4, S5, and S6 are linearly formed. Adjacent sides S1 to S6 are connected to each other by corner portions R1, R2, R3, R4, R5, and R6. Unlike the sides S1 to S6, the corner portions R1 to R6 are bent portions, and are formed in curved line shapes. A length (depth) of the groove portion 23c in the up-down direction is set with respect to the insertion wall portion 22b such that a gap 23i is formed between the bottom portion 23f and the insertion wall portion 22b while the insertion wall portion 22b is inserted into the groove portion 23c.

A rib 23g is formed in the groove portion 23c. As illustrated in FIG. 5, the rib 23g is formed to protrude downward from the bottom portion 23f of the groove portion 23c. A length (depth) D2 of the rib 23g in the up-down direction is set with respect to a length (depth) D1 of the gap 23i in the up-down direction such that a gap is formed between the lower end portion and the insertion wall portion 22b while the insertion wall portion 22b is inserted into the groove portion 23c. The rib 23g in the present embodiment has a flat plate shape. In addition, both end portions of the rib 23g in a direction perpendicular to the up-down direction and a direction in which the groove portion 23c extends are connected to the external wall portion 23d and the internal wall portion 23e, respectively. Further, the rib 23g is integrally formed with the upper cover 23. At least one rib 23g is formed on each of the sides S1 to S6. Specifically, a plurality of ribs 23g is formed on each of the sides S1, S2, S4, S5, and S6, and one rib 23g is formed on the side S3. The ribs 23g are formed at equal intervals on each of the sides S1, S2, S4, S5, and S6 at which the plurality of ribs 23g is formed. In addition, the ribs 23g are formed on each of the sides S1 to S6 with the corner portions R1 to R6 interposed therebetween. In other words, ribs 23g corresponding to each of the corner portions R1 to R6 are formed on two sides S1 to S6 connected to each of the corner portions R1 to R6.

Next, a description will be given of a flow of liquid when liquid, for example, water splashes onto the electrical connection box 1 according to the present embodiment from outside. A waterproof structure is configured to inhibit liquid from entering the inside of the housing 2 from outside between the box main body 22 and the upper cover 23 when the insertion wall portion 22b is inserted into the groove portion 23c, the offset portion 23h is positioned lower side of the stepped portion 22e, and the stepped portion 22e touches the external wall portion 23d as illustrated in FIG. 4 at the time of blocking the opening portion 22a by the upper cover 23, that is, in a locked state with respect to the box main body 22 of the upper cover 23 by the plurality of locking mechanisms 25. Therefore, when liquid merely splashes onto the housing 2 from outside, liquid does not infiltrate up to the gap 23i. Meanwhile, when liquid strongly collides with the housing 2, there is a possibility that liquid will enter the gap 23i from between the stepped portion 22e and the external wall portion 23d as indicated by an arrow A. When a small amount of liquid enters the gap 23i, a possibility that liquid flows in an extending direction of the groove portion 23c is low. In this case, liquid entering the gap 23i moves to lower side of the groove portion 23c as indicated by an arrow C of the same figure. Then, a portion thereof is discharged to the outside of the housing 2 by flowing to the drainage space portion 22d through between the insertion wall portion 22b and the internal wall portion 23e, and another portion thereof is discharged to the outside of the housing 2 through between the insertion wall portion 22b and the external wall portion 23d.

When liquid more strongly collides with the housing 2, and thus a large amount of liquid enters the gap 23i, liquid flows in the extending direction of the groove portion 23c. Liquid, which enters a gap 23i of a portion corresponding to one of the sides S1 to S5 in the groove portion 23c and flows in an extending direction of the infiltrated side S1 to S5, flows toward an end portion of the sides S1 to S5 in an extending direction as indicated by an arrow B of FIG. 3. One of the corner portions R1 to R6 is connected to the end portion of the sides S1 to S5 in the extending direction, and thus the liquid flowing in the extending direction of the infiltrated side S1 to S5 arrives at the corner portions R1 to R6. Herein, unlike the respective sides S1 to S5 having linear shapes, the respective corner portions R1 to R6 have curved line shapes and are bent. Thus, a flow of liquid is poor when compared to the respective sides S1 to S5, and liquid stays therein. When the rib 23g is formed in a course of travel of the liquid flowing in the extending direction of the groove portion 23c through the gap 23i of the infiltrated side S1 to S5 in the groove portion 23c, an area perpendicular to the course of travel of the liquid (an opening area of the gap 23i) becomes smaller by a portion in which the rib 23g is formed. Therefore, liquid collides with the rib 23g, and a flow of liquid becomes slow. In addition, a portion of the liquid colliding with the rib 23g is discharged to the outside of the housing 2 when a portion flows to the drainage space portion 22d through between the insertion wall portion 22b and the internal wall portion 23e. A flow of liquid flowing out of a space formed between the rib 23g and the insertion wall portion 22b is slow, and the liquid decreased in amount arrives at the corner portions R1 to R6.

As described in the foregoing, in the electrical connection box 1 according to the present embodiment, at least one rib 23g is formed to protrude downward from the bottom portion 23f of the groove portion 23c. Thus, when liquid flowing toward the corner portions R1 and R2 through the sides S1 to S5 of the groove portion 23c collides with the rib 23g before arriving at the corner portions R1 to R6, a flow of liquid arriving at the corner portions R1 to R6 can be slow, and the amount of the liquid can be reduced. Therefore, it is possible to reduce the amount of liquid staying in the corner portions R1 to R6 when compared to a case in which liquid arrives at the corner portions R1 to R6 without colliding with the rib 23g. In this way, liquid entering between the box main body 22 and the upper cover 23 from the outside of the housing 2 can be inhibited from spouting into the housing 2.

In addition, the rib 23g is connected to the external wall portion 23d and the internal wall portion 23e. Thus, it is possible to suppress deformation or collapse of the external wall portion 23d and the internal wall portion 23e in a direction perpendicular to the up-down direction, in particular, in a direction perpendicular to the extending direction of the groove portion 23c when a depth of the groove portion 23c is deep, that is, when lengths of the external wall portion 23d and the internal wall portion 23e included in the groove portion 23c from the bottom portion 23f are long in the up-down direction. In this way, a gap between the external wall portion 23d and the internal wall portion 23e can be inhibited from becoming narrow. Thus, insertion of the insertion wall portion 22b into the groove portion 23c can be inhibited from becoming difficult, and assembly of the upper cover 23 with respect to the box main body 22 can be inhibited from being degraded.

In addition, in the electrical connection box 1 according to the present embodiment, at least one rib 23g is formed on each of the sides S1 to S5. Thus, even when liquid enters the gap 23i from any one of the sides S1 to S5 among the respective sides S1 to S5, the amount of liquid staying in the corner portions R1 to R6 can be reduced when compared to liquid arriving at the corner portions R1 to R6. In this way, liquid entering between the box main body 22 and the upper cover 23 from the outside of the housing 2 can be inhibited from spouting into the housing 2 irrespective of a position at which the liquid enters the gap 23i.

In addition, in the electrical connection box 1 according to the present embodiment, the rib 23g is formed on each of the sides S1 to S5 with the corner portions R1 to R6 interposed therebetween. Thus, even when liquid enters the gap 23i from any one of the sides S1 to S5 among the respective sides S1 to S5, and the liquid flows toward any one of the corner portions R1 to R6 connected to the infiltrated sides S1 to S5, the amount of liquid staying in the corner portions R1 to R6 can be reliably reduced when compared to liquid arriving at the corner portions R1 to R6. In this way, liquid entering between the box main body 22 and the upper cover 23 from the outside of the housing 2 can be inhibited from spouting into the housing 2 irrespective of a position at which the liquid enters the gap 23i.

Since the wire harness 100 described above includes the electrical connection box 1, liquid entering between the box main body 22 and the upper cover 23 from the outside of the housing 2 can be inhibited from spouting into the housing 2.

In addition, in the electrical connection box 1 according to the present embodiment, when a plurality of ribs 23g is formed on each of the sides S1 to S5, the ribs 23g are formed at equal intervals. However, the ribs 23g may be formed at unequal intervals.

Figure 6:
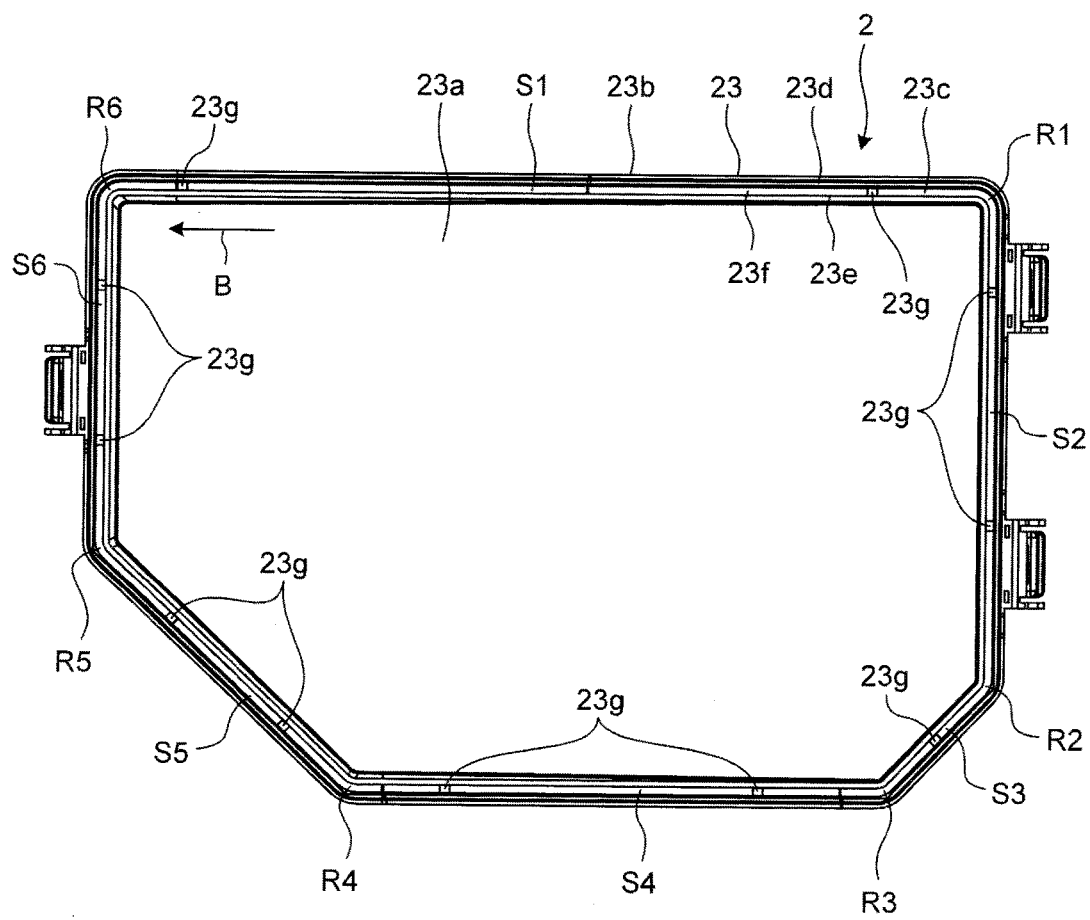
FIG. 6 is a view illustrating a modified example of the upper cover of the electrical connection box according to the embodiment.

FIG. 6 is a diagram illustrating a modified example of the upper cover of the electrical connection box according to the embodiment. As illustrated in FIG. 6, only ribs 23g interposing each of the corner portions R1 to R6 therebetween may be formed on the respective sides S1 to S5. In addition, intervals of a plurality of ribs 23g on the sides S1 to S5 may be sparse and dense. For example, ribs 23g may be formed densely on a side of the corner portions R1 to R6 and sparsely on a center side on the sides S1 to S5. In this case, a flow of liquid at the gap 23i becomes poor, and the amount of flow decreases toward the corner portions R1 to R6. Thus, liquid can be reliably inhibited from spouting into the housing 2.

In addition, in the present embodiment, the rib 23g is formed in the flat plate shape. However, the present embodiment is not limited thereto. For example, the rib 23g may have a shape in which a side in the longitudinal direction widens toward a rear surface, for example, a triangle or a trapezoid when viewed in a direction perpendicular to the up-down direction and the extending direction of the groove portion 23c. In this case, liquid attached to the rib 23g easily moves to a lower end portion of the rib 23g, and liquid separated from the rib 23g moves toward a lower side of the gap 23i. Thus, liquid can be inhibited from moving in the extending direction of the groove portion 23c.

In the electrical connection box and the wire harness according to the present embodiment, at least one rib protruding downward from the bottom portion of the groove portion is formed, and thus there is an effect that it is possible to inhibit liquid entering between the first housing member and the second housing member from the outside of the housing from spouting into the housing.

Although the present invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
a first housing member having an opening portion in an upper end portion at a time of installation; and
a second housing member that is positioned at an upper side with respect to the first housing member, and blocks the opening portion at the time of installation, wherein
the first housing member has an insertion wall portion continuously formed along an outer circumference of the first housing member in the upper end portion at the outer circumference of the first housing member,
the second housing member has a groove portion continuously formed along an outer circumference of the second housing member in a lower end portion at the outer circumference of the second housing member, the insertion wall portion being inserted into the groove portion from a lower side when the opening portion of the first housing member is blocked,
at least one rib protruding downward from a bottom portion of the groove portion is formed in the groove portion, and
both end portions of the rib in a direction perpendicular to an up-down direction and a direction in which the groove portion extends are connected to the second housing member, and a space is formed between the rib and the insertion wall portion in a state in which the second housing member closes the opening portion, wherein the rib and the insertion wall portion do not contact each other in the up-down direction in the state in which the second housing member closes the opening portion.

2. The electrical connection box according to claim 1, wherein
the at least one rib is provided in plurality,
the groove portion has a plurality of sides, and a plurality of corner portions, each of the corner portions connecting a respective pair of the sides, and
each of the sides has at least one of the ribs.

3. The electrical connection box according to claim 2, wherein
the ribs are arranged in a plurality of pairings such that each of the corner portions is interposed between the ribs of a respective one of the pairings.

4. A wire harness comprising:
an electric wire; and
an electrical connection box including a first housing member having an opening portion in an upper end portion at a time of installation, and a second housing member that is positioned at an upper side with respect to the first housing member, and blocks the opening portion at the time of installation, wherein
the first housing member has an insertion wall portion continuously formed along an outer circumference of the first housing member in the upper end portion at the outer circumference of the first housing member,
the second housing member has a groove portion continuously formed along an outer circumference of the second housing member in a lower end portion at the outer circumference of the second housing member, the insertion wall portion being inserted into the groove portion from a lower side when the opening portion of the first housing member is blocked,
at least one rib protruding downward from a bottom portion of the groove portion is formed in the groove portion, and
both end portions of the rib in a direction perpendicular to an up-down direction and a direction in which the groove portion extends are connected to the second housing member, and a space is formed between the rib and the insertion wall portion in a state in which the second housing member closes the opening portion, wherein the rib and the insertion wall portion do not contact each other in the up-down direction in the state in which the second housing member closes the opening portion.

* * * * *